United States Patent
Kim et al.

(10) Patent No.: US 9,985,236 B2
(45) Date of Patent: May 29, 2018

(54) DISPLAY APPARATUS AND PORTABLE TERMINAL

(71) Applicant: SAMSUNG DISPLAY CO., LTD., Yongin-si, Gyeonggi-do (KR)

(72) Inventors: Taejin Kim, Hwaseong-si (KR); Dong-hoon Lee, Hwaseong-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 42 days.

(21) Appl. No.: 15/067,549

(22) Filed: Mar. 11, 2016

(65) Prior Publication Data

US 2017/0040562 A1 Feb. 9, 2017

(30) Foreign Application Priority Data

Aug. 3, 2015 (KR) .......................... 10-2015-0109598

(51) Int. Cl.
| | |
|---|---|
| *G06F 1/16* | (2006.01) |
| *H01L 51/52* | (2006.01) |
| *H01L 27/32* | (2006.01) |
| *H01L 51/00* | (2006.01) |

(52) U.S. Cl.
CPC ............ *H01L 51/52* (2013.01); *G06F 1/1652* (2013.01); *H01L 27/3241* (2013.01); *H01L 27/3276* (2013.01); *H01L 51/0097* (2013.01); *H01L 51/5253* (2013.01); *H01L 27/323* (2013.01); *H01L 2251/5338* (2013.01); *Y02E 10/549* (2013.01)

(58) Field of Classification Search
CPC ........................... H01L 27/3241; H01L 51/52
See application file for complete search history.

(56) References Cited

U.S. PATENT DOCUMENTS

| | | | |
|---|---|---|---|
| 9,569,018 B2* | 2/2017 | Kang | ........................ G06F 3/03 |
| 2011/0134144 A1* | 6/2011 | Moriwaki | ............ G09G 3/3208 345/660 |
| 2013/0100053 A1* | 4/2013 | Kang | ........................ G06F 3/03 345/173 |

(Continued)

FOREIGN PATENT DOCUMENTS

| | | |
|---|---|---|
| KR | 10-2013-0043526 A | 4/2013 |
| KR | 10-2014-0022180 A | 2/2014 |
| KR | 10-2014-0048007 A | 4/2014 |

*Primary Examiner* — Hoa C Nguyen
*Assistant Examiner* — Keith Depew
(74) *Attorney, Agent, or Firm* — Lee & Morse, P.C.

(57) ABSTRACT

A display apparatus includes a display panel and a variable resistance area. The display panel includes a foldable area, a non-foldable area, and a folding axis. The variable resistance area may overlap the foldable area and includes a first resistance part and a second resistance part. The first resistance part has a first resistance when the display panel is folded with a curvature greater than a first curvature and a second resistance different from the first resistance when the display panel is folded with a curvature less than the first curvature. The second resistance part has a third resistance when the display panel is folded with a curvature greater than a second curvature and a fourth resistance different from the third resistance when the display panel is folded with a curvature less than the second curvature. The second curvature may be greater than the first curvature.

21 Claims, 11 Drawing Sheets

(56) References Cited

U.S. PATENT DOCUMENTS

| | | | |
|---|---|---|---|
| 2013/0312541 A1* | 11/2013 | Majidi | G01B 7/18 |
| | | | 73/862.454 |
| 2014/0028596 A1* | 1/2014 | Seo | G06F 3/0487 |
| | | | 345/173 |
| 2014/0098075 A1* | 4/2014 | Kwak | G06F 3/0487 |
| | | | 345/204 |
| 2014/0204285 A1* | 7/2014 | Jang | G06F 3/044 |
| | | | 349/12 |
| 2015/0043187 A1 | 2/2015 | Lee et al. | |
| 2015/0169006 A1* | 6/2015 | Chong | G09G 3/20 |
| | | | 345/173 |
| 2016/0062485 A1* | 3/2016 | Kondo | G09G 5/00 |
| | | | 345/156 |
| 2016/0116944 A1* | 4/2016 | Lee | H04M 1/022 |
| | | | 361/679.26 |
| 2016/0147362 A1* | 5/2016 | Eim | G06F 1/1641 |
| | | | 345/173 |
| 2016/0179236 A1* | 6/2016 | Shin | G06F 1/1616 |
| | | | 345/173 |
| 2016/0195938 A1* | 7/2016 | Kim | H04B 1/3827 |
| | | | 345/156 |
| 2016/0206447 A1* | 7/2016 | Auberger | A61F 2/64 |

* cited by examiner

DISPLAY APPARATUS AND PORTABLE TERMINAL

CROSS-REFERENCE TO RELATED APPLICATION

Korean Patent Application No. 10-2015-0109598, filed on Aug. 3, 2015, and entitled, "Display Apparatus and Portable Terminal," is incorporated by reference herein in its entirety.

BACKGROUND

1. Field

One or more embodiments described herein relate to a display apparatus and a portable terminal.

2. Description of the Related Art

Various types of displays have been developed for televisions, mobile phones, tablet computers, navigation units, game consoles, and other multimedia devices. One recent innovation involves the development of flexible displays that curve, bend, fold, roll, or stretch.

SUMMARY

In accordance with one or more embodiments, a display apparatus includes a display panel to display an image, the display panel including a foldable area, a non-foldable area, and a folding axis; and a variable resistance area to overlap the foldable area, wherein the variable resistance area includes: a first resistance part having a first resistance when the display apparatus is folded with a curvature greater than a first curvature and a second resistance different from the first resistance when the display apparatus is folded with a curvature less than the first curvature; and a second resistance part having a third resistance when the display apparatus is folded with a curvature greater than a second curvature and a fourth resistance different from the third resistance when the display apparatus is folded with a curvature less than the second curvature, the second curvature being greater than the first curvature.

The first resistance part may includes a first sub resistance part and a second sub resistance part, the second resistance part may include a third sub resistance part and a fourth sub resistance part, when the display apparatus is folded with the first curvature or more, the first sub resistance part and the second sub resistance part may change from between a mutual contact state and a mutual non-contact state, and when the display apparatus is folded with the second curvature or more, the third sub resistance part and the fourth sub resistance part may change between the mutual contact state and the mutual non-contact state.

A first end of the first sub resistance part contacting the second sub resistance part and a second end of the second sub resistance part contacting the first sub resistance part may be in a first area adjacent to a folding axis, and a third end of the third sub resistance part contacting the fourth sub resistance part and a fourth end of the fourth sub resistance part contacting the third sub resistance part may be in a second area, and the second area may be spaced apart from the folding axis in a second direction crossing a first direction in which the folding axis extends.

When the display apparatus is folded with the first curvature, the first area may overlap the foldable area, and when the display apparatus is folded with the second curvature, the first area and the second area may overlap the foldable area.

When the first sub resistance part and the second sub resistance part contact each other, the first resistance part may have a resistance less than the first resistance part when the first sub resistance part and the second sub resistance part do not contact each other, and when the third sub resistance part and the fourth sub resistance part contact each other, the second resistance part may have a resistance less than the second resistance part when the third sub resistance part and the fourth sub resistance part do not contact each other.

Each of the first sub resistance part, the second sub resistance part, the third sub resistance part, and the fourth sub resistance part may include a first metal line extending in a second direction crossing a first direction in which the folding axis extends; a second metal line spaced apart from the first metal line in the first direction, the second metal line extending in the second direction; and a plurality of third metal lines to electrically connect the first metal line to the second metal line. The third metal lines may be spaced apart from each other in the second direction.

When a surface in which strain is not generated when the display apparatus is folded with a predetermined curvature corresponds to a neutral surface, the display apparatus may be divided into a compressive area adjacent to a curvature center of the predetermined curvature and a tensile area facing the compressive area, with the neutral surface therebetween with respect to the neutral surface, and the variable resistance area may be on at least one of the compressive area or the tensile area.

The variable resistance area may be on the compressive area: when the display apparatus is folded with the first curvature, the first sub resistance part and the second sub resistance part are to change from the mutual non-contact state to the mutual contact state, and the third sub resistance part and the fourth sub resistance part are maintained in the mutual non-contact state, and when the display apparatus is folded with the second curvature or more, the third sub resistance part and the fourth sub resistance part are to change from the mutual non-contact state into the mutual contact state.

The variable resistance area may be on the tensile area: when the display apparatus is folded with the first curvature, the first sub resistance part and the second sub resistance part are to change from the mutual contact state into the mutual non-contact state, and when the display apparatus is folded with the second curvature or more, the third sub resistance part and the fourth sub resistance part are to change from the mutual contact state into the mutual non-contact state. The display apparatus includes at least one resistance measuring circuit to measure resistance of each of the first and second resistance parts.

In accordance with one or more other embodiments, a portable terminal includes a display panel to display an image, the display panel including a first folding axis in a first foldable area extending in a first direction; and a first resistance part to overlap the first foldable area, the first resistance part to vary in resistance when the portable terminal is folded with a first curvature or more, wherein the first resistance part includes: a first sub resistance part; and a second sub resistance part to change between a state contacting the first sub resistance part to and a state non-contacting the first sub resistance part when the portable terminal is folded with the first curvature or more.

The portable terminal may include a second resistance part to overlap the first foldable area, the second resistance part varying in resistance when the portable terminal is folded with a second curvature that is greater than the first curvature, the second resistance part including: a third sub resistance part; and a fourth resistance part to change between a state contacting the third sub resistance part and a state non-contacting the third sub resistance part when the portable terminal is folded with the second curvature or more.

The portable terminal includes a first area on which the first and second sub resistance parts contact each other is to overlap the first folding axis or is to be spaced a first distance from the first folding axis in a second direction crossing the first direction on a plane, and a second area on which the third and fourth sub resistance parts contact each other is to be spaced a second distance greater than the first distance from the first folding axis in the second direction.

Each of the first, second, third, and fourth sub resistance parts may include a first metal line extending in a second direction crossing the first direction; a second metal line spaced apart from the first metal line in the first direction and extending in the second direction; and a plurality of third metal lines to electrically connect the first and second metal lines to each other.

When a surface in which strain is not generated when the portable terminal is folded with a predetermined curvature corresponds to a neutral surface, the portable terminal may be divided into a compressive area adjacent to a curvature center of the predetermined curvature and a tensile area facing the compressive area, with the neutral surface therebetween with respect to the neutral surface, and the first and second resistance parts may be on at least one of the compressive area or tensile area.

The first and second resistance parts may be on the compressive area: when the portable terminal is folded with the first curvature, the first sub resistance part and the second sub resistance part are to change from the mutual non-contact state to the mutual contact state, and the third sub resistance part and the fourth sub resistance part are to be maintained in the mutual non-contact state, and when the portable terminal is folded with the second curvature or more, the third sub resistance part and the fourth sub resistance part are to change from the mutual non-contact state to the mutual contact state.

The first and second resistance parts may be on the tensile area: when the portable terminal is folded with the first curvature, the first sub resistance part and the second sub resistance part are to change from the mutual contact state to the mutual non-contact state, the third sub resistance part and the fourth sub resistance part are to be maintained in the mutual contact state, and when the portable terminal is folded with the second curvature or more, the third sub resistance part and the fourth sub resistance part are to change from the mutual contact state to the mutual non-contact state.

The portable terminal may include a second foldable area spaced apart from the first foldable area in a second direction crossing the first direction; a second folding axis in the second foldable area; and a second resistance part on the second foldable area, wherein the second resistance part may vary in resistance when the portable terminal is folded with a second curvature or more, and wherein the second resistance part may include a third sub resistance part; and a fourth sub resistance part to change from a state contacting the third sub resistance part and a state non-contacting the third sub resistance part when the portable terminal is folded with the second curvature or more.

In accordance with one or more other embodiments, a display apparatus includes a display panel including a display area and a non-display area, the display panel to fold on the basis of a folding axis; and a resistance area overlapping the non-display area, the resistance area to vary in resistance when the display panel is folded with a predetermined curvature or more, wherein: the resistance area includes a first sub resistance part and a second sub resistance part to contact or non-contact an end of the first sub resistance part, when the display panel is folded with a predetermined curvature or more, the first and second sub resistance parts are to change from between a mutual contacting state and mutual non-contact state.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
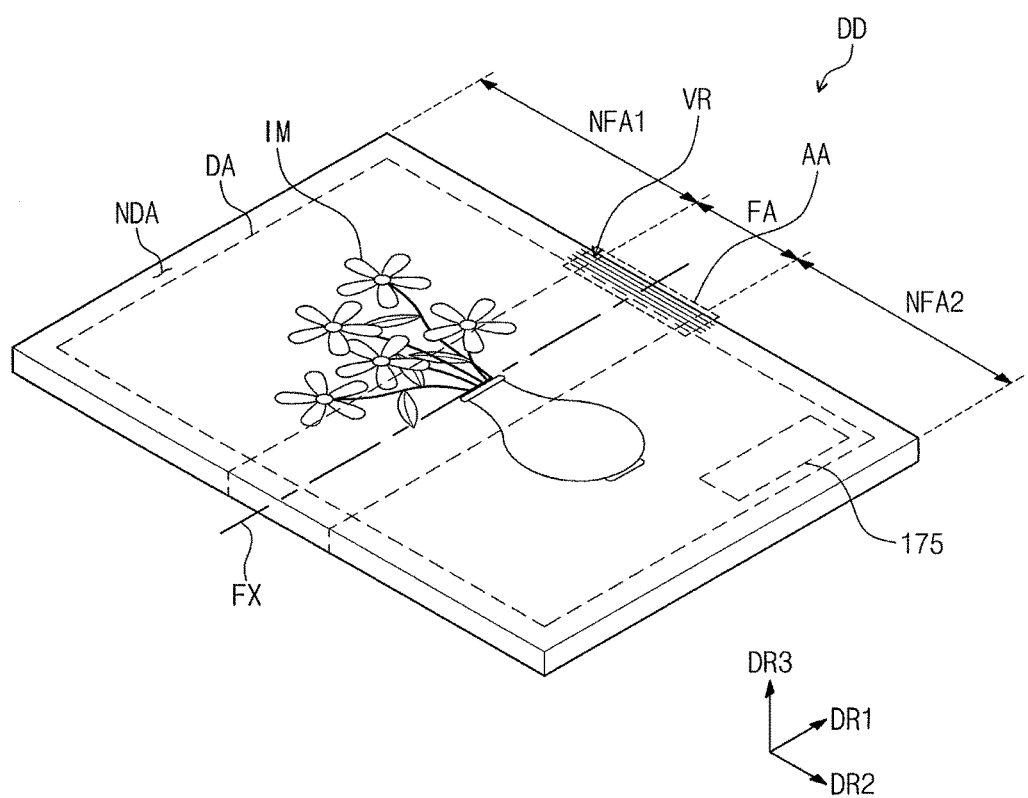
FIGS. 1A-1C illustrate an embodiment of a display apparatus in various states.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1B:
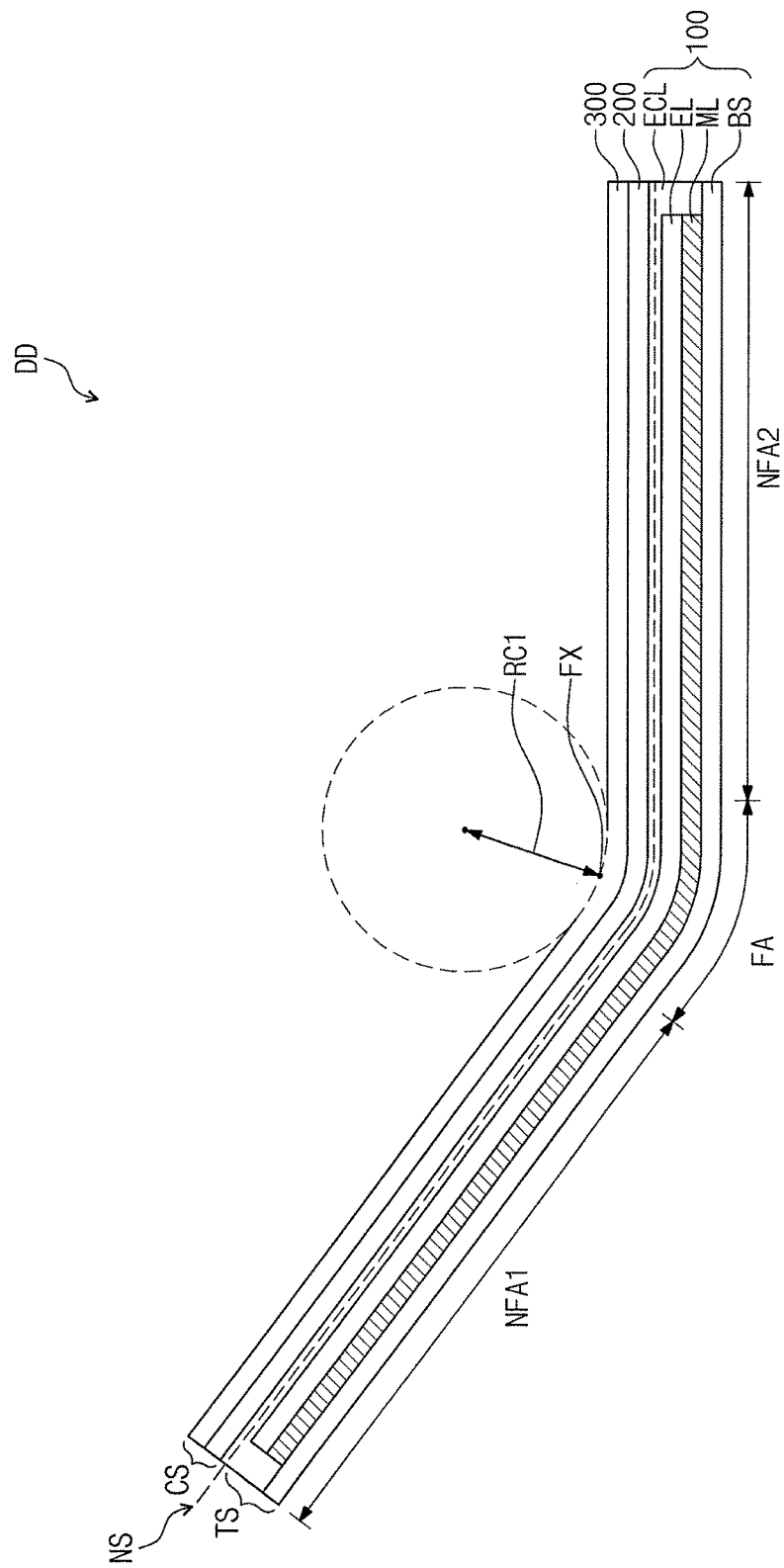
Figure 1C:
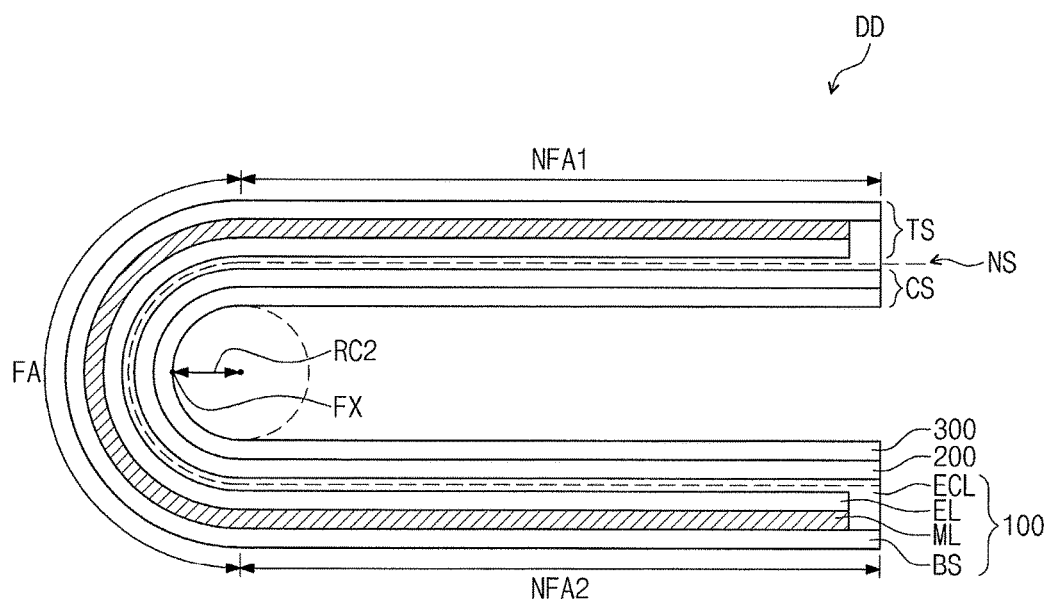

FIG. 1A illustrates an embodiment of a display apparatus DD. FIG. 1B illustrates one state of the display apparatus DD. FIG. 1C illustrates another state of the display apparatus DD.

Referring to FIGS. 1A, 1B, and 1C, the display apparatus is illustrated as a foldable portable terminal. However, the display apparatus DD may be a different type of electronic device in another embodiment. For example, the display apparatus DD may be used in large-sized electronic devices (e.g., foldable or curvable televisions or an advertisement board) and small and medium-sized electronic devices (e.g., personal computers, notebook computers, personal digital terminals, navigation units for vehicles, game consoles, portable electronic devices, wrist watch-type electronic devices, and cameras to name a few).

The display apparatus DD includes a display area DA for displaying an image IM and a non-display area NDA which does not display an image IM. The display apparatus DD may have a rectangular shape, for example, having a pair of short sides extending in a first direction DR1 and a pair of long sides extending in a second direction DR2. A third direction DR3, which is perpendicular to the first and second directions DR1 and DR2, may correspond to a thickness direction of the display apparatus DD.

The display apparatus DD may be divided into a foldable area FA folded along a folding axis FX and first and second non-foldable areas NFA1 and NFA2 that are not folded. The foldable area FA is defined as an area that receives stress and is strained as the display apparatus DD is folded. The foldable area FA may be an area extending from the folding axis FX in the second direction DR2 and in a direction opposite to the second direction DR2. The foldable area FA has a size that varies according to a folded degree of the display apparatus DD.

The display apparatus DD may include a display panel 100, a touch panel 200, a window member 300, and a variable resistance area VR. The display panel 100 may display the image IM according to an applied signal. The display panel 100 may be divided into a display area overlapping the display area DA and a non-display area overlapping the non-display area NDA on a plane.

The display panel 100 may be, for example, an organic light emitting display panel, a liquid crystal display panel, a plasma display panel, an electrophoretic display panel, or an electrowetting display panel. Hereinafter, the display panel 100 will be described as an organic light emitting display panel.

The display panel 100 may include a base substrate BS, a wiring layer ML, an organic light emitting device layer EL, and an encapsulation layer ECL. The base substrate BS may be a flexible substrate formed, for example, of plastic having high thermal resistance and durability. Examples include polyethylene ether phthalate, polyehtylene naphthalate, polycarbonate, polyallylate, polyetherimides, polyethersulfone, and polyimide. In another embodiment, the base substrate BS may be a film formed of another type of material that does not brake even when bent or otherwise flexed.

The wiring layer ML is on the base substrate BS. The wiring layer ML may include gate and data lines for applying a signal to the organic light emitting device layer EL and a thin film transistor corresponding to each of pixels.

The organic light emitting device layer EL may include a first electrode, a second electrode, and an organic layer. The first electrode may be an anode electrode or a positive electrode that generates holes. The second electrode may be a cathode electrode or a negative electrode that generates electrons. The organic layer may have a multilayer structure and includes an organic material. The organic layer may include an organic emission layer formed of low molecular organic substances and/or high molecular organic substances. The holes and electrons may be respectively injected into the organic layer from the first and second electrodes and then be coupled to each other to form excitons. When the excitons change from an excited state to a ground state, the organic emission layer emits light.

The encapsulation layer ECL may include a thin film encapsulation layer (TEF), e.g., a plurality of inorganic thin films and a plurality of organic thin films. The encapsulation layer ECL may cover the organic light emitting device layer EL and block air and moisture to protect the organic light emitting device layer EL. According to one embodiment, an encapsulation substrate may be substituted for the encapsulation layer ECL. The encapsulation substrate may be spaced apart from the base substrate BS, with the organic light emitting device layer EL located therebetween. The encapsulation substrate and the base substrate BS may be coupled to each other, for example, by a sealing agent disposed along an edge of the base substrate BS. The encapsulation substrate may be, for example, a flexible substrate.

The touch panel 200 may acquire coordinate information of an input position. The touch panel 200 may be on the display panel 100 and may be classified, for example, as a resistive film touch panel, a capacitive touch panel, or an electromagnetic touch panel. The touch panel 200 may include two kinds of sensors crossing each other. The capacitive touch panel may acquire coordinate information of a position touched in a self-capacitance or mutual capacitance manner.

Although a window member 300 is not separately divided, the window member 300 may include a base member and a black mattress. The base member may include, for example, a silicon substrate, a glass substrate, a sapphire substrate, or a plastic film. The black mattress may be on a rear surface of the base member to define a bezel area of the display apparatus DD, e.g., the non-display area NDA. The black mattress may be a colored organic layer formed, for example, through a coating process. Also, the window member 300 may further include a functional coating layer on an entire surface of the base member. The functional coating layer may include an anti-fingerprint layer, an anti-reflection layer, a hard coating layer, and/or another layer.

The variable resistance area VR may overlap the foldable area FA and the non-display area NDA. When the display apparatus DD is folded with a predetermined curvature or more, the variable resistance area VR may vary in resistance. For example, in cases where the display apparatus DD is folded as in FIGS. 1B and 1C, the variable resistance area VR may have resistances that are different from each other.

A neutral surface NS may correspond to a surface which does not experience strain when the display apparatus DD is folded with a predetermined curvature. This surface may be one which, for example, does not expand or contract when the display device DD is folded. Thus, bending stress applied on the neutral surface NS may be about 0. The display apparatus DD is divided into a compressive unit CS adjacent to a center of the predetermined curvature and a tensile area TS facing the compressive unit CS, with the neutral surface NS located therebetween. An area of the compressive unit CS that overlaps the foldable area FA may receive compressive force. An area of the tensile area TS that overlaps the foldable area FA may receive tensile force.

Although an example of the structure in which the neutral surface NS is defined in the encapsulation layer ECL is exemplified in FIGS. 1B and 1C, the neutral surface may be configured differently in another embodiment. For example, the neutral surface NS, in which strain due to warpage is not generated, may move based on a thickness, modulus, and the like, of each of components constituting the display apparatus DD.

The variable resistance area VR may be on at least one of the compressive unit CS or/and the tensile area TS. For example, when the variable resistance area VR is on the compressive unit CS, the variable resistance area VR may be between the window member 300 and the touch panel 200, either on the same layer as the touch electrode of the touch panel 200 or between the display panel 100 and the touch panel 200. When the variable resistance area VR is on the tensile area TS, the variable resistance area VR may be on a top or bottom surface of the base substrate BS or on the same layer as the wiring layer ML.

The variable resistance area VR may include a plurality of metal lines. For example, the variable resistance area VR may include a metal line on a base member such as a film. Alternatively, the variable resistance area VR may be on one area of each of the components of the display apparatus DD, without a separate film.

The variable resistance area VR on one side of the display apparatus DD is illustrated in the current embodiment. In another embodiment, the variable resistance area VR may be disposed on both sides of the display apparatus DD. For example, the variable resistance area VR may be on all of areas simultaneously overlapping the foldable area FA and the non-display area NDA on a plane.

Referring to FIGS. 1B and 1C, the display apparatus DD may be folded along the folding axis FX in order to allow a first non-foldable area NFA1 to face a second non-foldable area NFA2. The display apparatus DD may be considered to be in an inner folded state when display surfaces having areas different from each other are folded to face each other. Thus, for example, the display apparatus DD may be considered to be in an inner folded state when the first non-foldable area NFA1 rotates in a clockwise direction along the folding axis FX. The display apparatus DD may be considered to be in an outer folded states when the display surfaces of the first non-foldable area NFA1 and the second non-foldable area NFA2 fold along the folding axis FX to face outside. Here, the display surface may have areas different from each other.

Referring to FIG. 1B, the flexible display apparatus DD may be folded with a first curvature. For example, the foldable area FA of the display apparatus DD may have a first curvature radius RC1. Referring to FIG. 1C, the flexible display apparatus DD may be folded with a second curvature. For example, the foldable area FA may have a second curvature radius RC2. In one embodiment, the first curvature may be less than the second curvature, and the first curvature radius RC1 may be greater than the second curvature radius RC2.

The intensity of stress generated in the display apparatus DD and the size of an area in which the stress is generated may vary according to the folding degree of the display apparatus DD. For example, the intensity of the stress and the size of the area in which the stress is generated when the display apparatus DD is folded as in FIG. 1C may be greater than those when the display apparatus DD is folded as in FIG. 1B.

Figure 2:
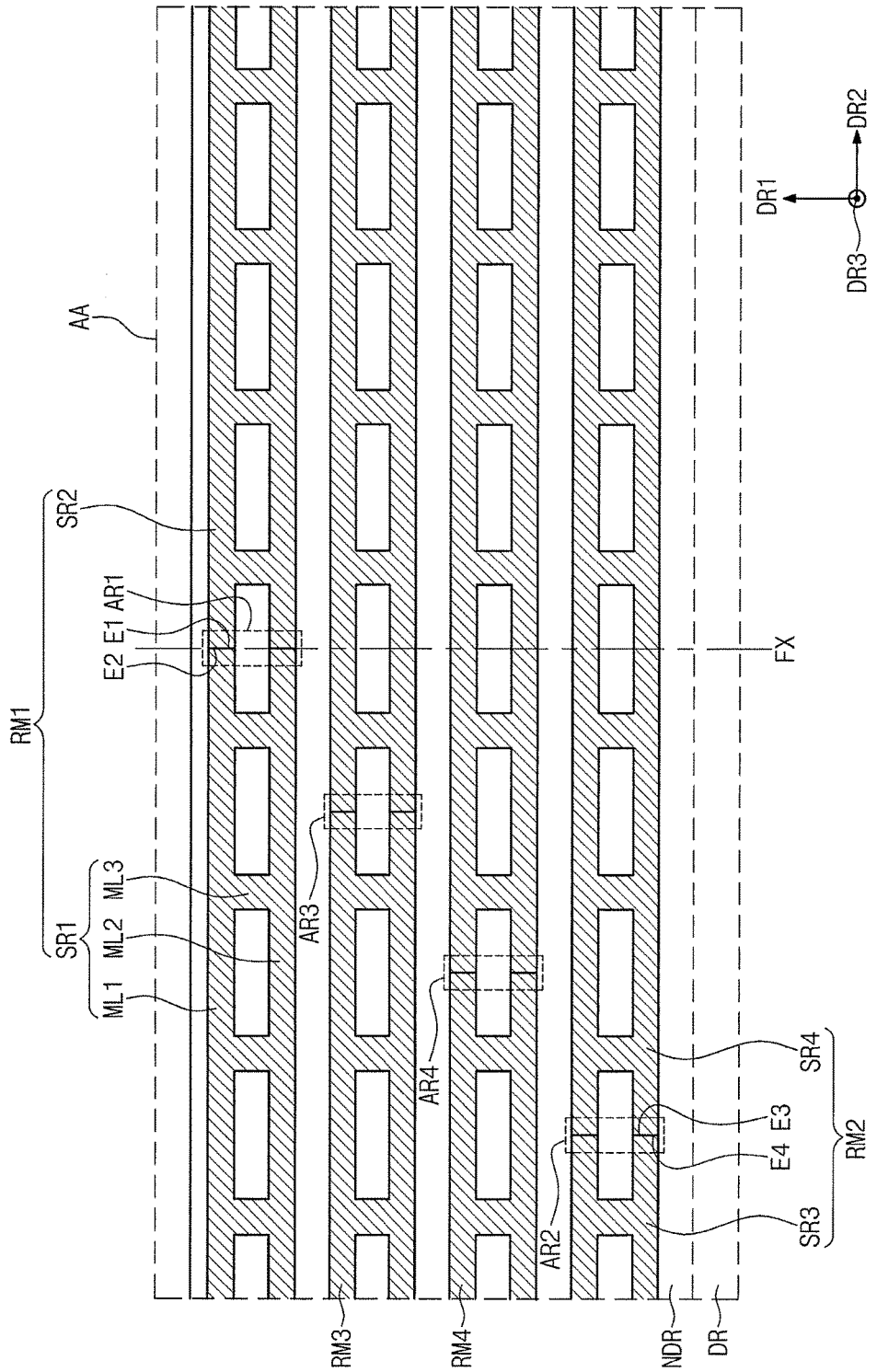
FIG. 2 illustrates an embodiment of area AA in FIG. 1A.

FIG. 2 is an enlarged view of area AA of FIG. 1A according to one embodiment. Referring to FIGS. 1A and 2, the variable resistance area VR may be on the tensile area TS of the display apparatus DD. The variable resistance area VR may include a first resistance part RM1, a second resistance part RM2, a third resistance part RM3, and a fourth resistance part RM4.

Each of the first resistance part RM1, the second resistance part RM2, the third resistance part RM3, and the fourth resistance part RM4 may include a plurality of sub resistance parts that change between non-contact and contact states as the display apparatus DD is folded. In one embodiment, when the display apparatus DD is folded, two of the sub resistance parts that face each other change from the contact state to the non-contact state.

The first resistance part RM1 includes a first sub resistance part SR1 and a second sub resistance part SR2, and the second resistance part RM2 includes a third sub resistance part SR3 and a fourth sub resistance part SR4. Each of the third resistance part RM3 and the fourth resistance part RM4 may have a structure similar to the first resistance part RM1 and the second resistance part RM2.

When the display apparatus DD is flat, the first sub resistance part SR1 and the second sub resistance part SR2 may contact each other, and the third sub resistance part SR3 and the fourth sub resistance part SR4 may contact each other.

The first sub resistance part SR1, the second sub resistance part SR2, the third sub resistance part SR3, and the fourth sub resistance part SR4 may include a first metal line ML1, a second metal line ML2, and third metal lines ML3, respectively. Each of the first metal line ML1, the second metal line ML2, and the third metal lines ML3 may be formed of an electrically conductive metal. In one embodiment, the first metal line ML1, the second metal line ML2, and the third metal lines ML3 may be formed of the same metal as each other. In another embodiment, the metal lines may be formed from different metals. For example, the first metal line ML1 and the second metal line ML2 may formed of a metal having relatively low resistance and the third metal lines ML3 may be formed of a metal having relatively high resistance.

Each of the first metal line ML1 and the second metal line ML2 may extend in the second direction DR2, which crosses the first direction DR1 in which the folding axis FX extends. The second metal line ML2 may be spaced apart from the first metal line ML1 in the first direction DR1. Each of the third metal lines ML3 may electrically connect the first and second metal lines ML1 and ML2 to each other. The third metal lines ML3 may be spaced apart from each other in the second direction DR2. The third metal lines ML3 may be connected in parallel to each other by the first and second metal lines ML1 and ML2.

A first end E1 of the first sub resistance part SR1 contacting the second sub resistance part SR2 and a second end E2 of the second sub resistance part SR2 contacting the first sub resistance part SR1 may be disposed on a first area AR1. A third end E3 of the third sub resistance part SR3 contacting the fourth sub resistance part SR4 and a fourth end E4 contacting the third sub resistance part SR3 may be disposed on a second area AR2.

The first area AR1 overlaps the folding axis FX in the current embodiment. In another embodiment, the first area AR1 may not overlap the folding axis FX. For example, the first area AR1 may be spaced a first distance from the folding axis FX. The second area AR2 may be spaced a second distance from the folding axis FX. The second distance may be, for example, greater than the first distance.

The ends that contact each other of the sub resistance parts of the third resistance part RM3 may be on a third area AR3. The ends that contact each other of the sub resistance parts of the fourth resistance part RM4 may be on a fourth area AR4.

A third distance between the third area AR3 and the folding axis FX may be greater than the first distance, a fourth distance between the fourth area AR4 and the folding axis FX may be greater than the third distance and less than the second distance, and the second distance may be greater than the first, third, and fourth distances. The first resistance part RM1, the third resistance part RM3, the fourth resistance part RM4, and the second resistance part RM2 are sequentially disposed in the current embodiment. In another embodiment, the arrangement order of the first to fourth resistance parts RM1, RM2, RM3, and RM4 may be different.

Also, in another embodiment, two resistance parts of the first to forth resistance parts RM1, RM2, RM3, and RM4 may be on the area AA. The remaining two resistance parts may face the two resistance parts, with the non-display area NDA therebetween.

In the current embodiment, the variable resistance area VR includes four resistance parts RM1, RM2, RM3, and RM4. In another embodiment, the variable resistance area VR may include a different number of resistance parts. For example, the variable resistance area VR may include only one resistance part, in the case of determining the folded position of the display apparatus DD or whether the display apparatus DD is folded at a predetermined angle or more. In another embodiment, the variable resistance area VR may include more than four resistance parts.

Figure 3:
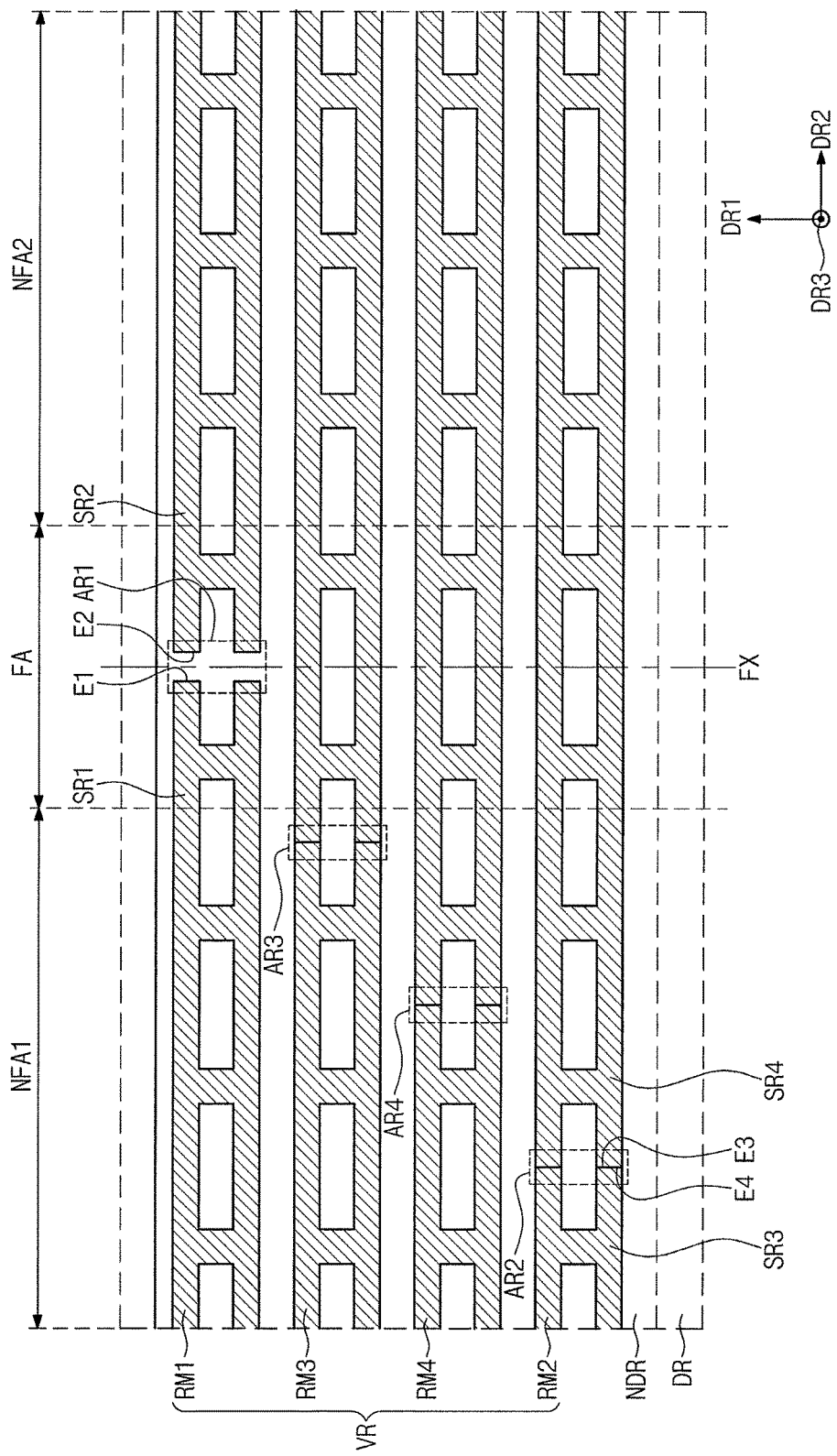
FIG. 3 illustrates area AA in the state of FIG. 1B.

FIG. 3 is an enlarged view of area AA when the display apparatus of FIG. 2 is in the same state as that of FIG. 1B. Referring to FIGS. 1B and 3, when the display apparatus DD is folded with the first curvature, compressive force and tensile force are generated in the display apparatus DD. When a portion in which the compressive force and the tensile force are generated is defined as the foldable area FA, the foldable area FA is bent with the first curvature and has the first curvature radius RC1.

When the display apparatus DD is folded with the first curvature, the foldable area FA may overlap the first area AR1. Accordingly, the tensile force may be generated in the first area AR1. As a result, the first end E1 and the second end E2 disposed on the first area AR1 may change from a mutual contact state to a mutual non-contact state. Since the number of third metal lines ML3 connected in parallel to each other is reduced when the first and second ends E1 and E2 contact each other, as compared to the case in which the first and second ends E1 and E2 do not contact each other, the first resistance part RM1 may be reduced in terms of resistance.

The variation in resistance of the first to fourth resistance parts RM1, RM2, RM3, and RM4 represent a variation in comparison to the resistance of the first to fourth resistance parts RM1, RM2, RM3, and RM4 when the display apparatus DD is flat. When the first resistance part RM1 of the first to fourth resistance parts RM1, RM2, RM3, and RM4 varies in resistance, a controller of the display apparatus DD (e.g., controller 175 in FIG. 1A) may compensate data with respect to an image displayed on the foldable area FA when the display apparatus DD is folded with the first curvature. Thus, the foldable area FA may be improved to thereby improve display quality.

Figure 4:
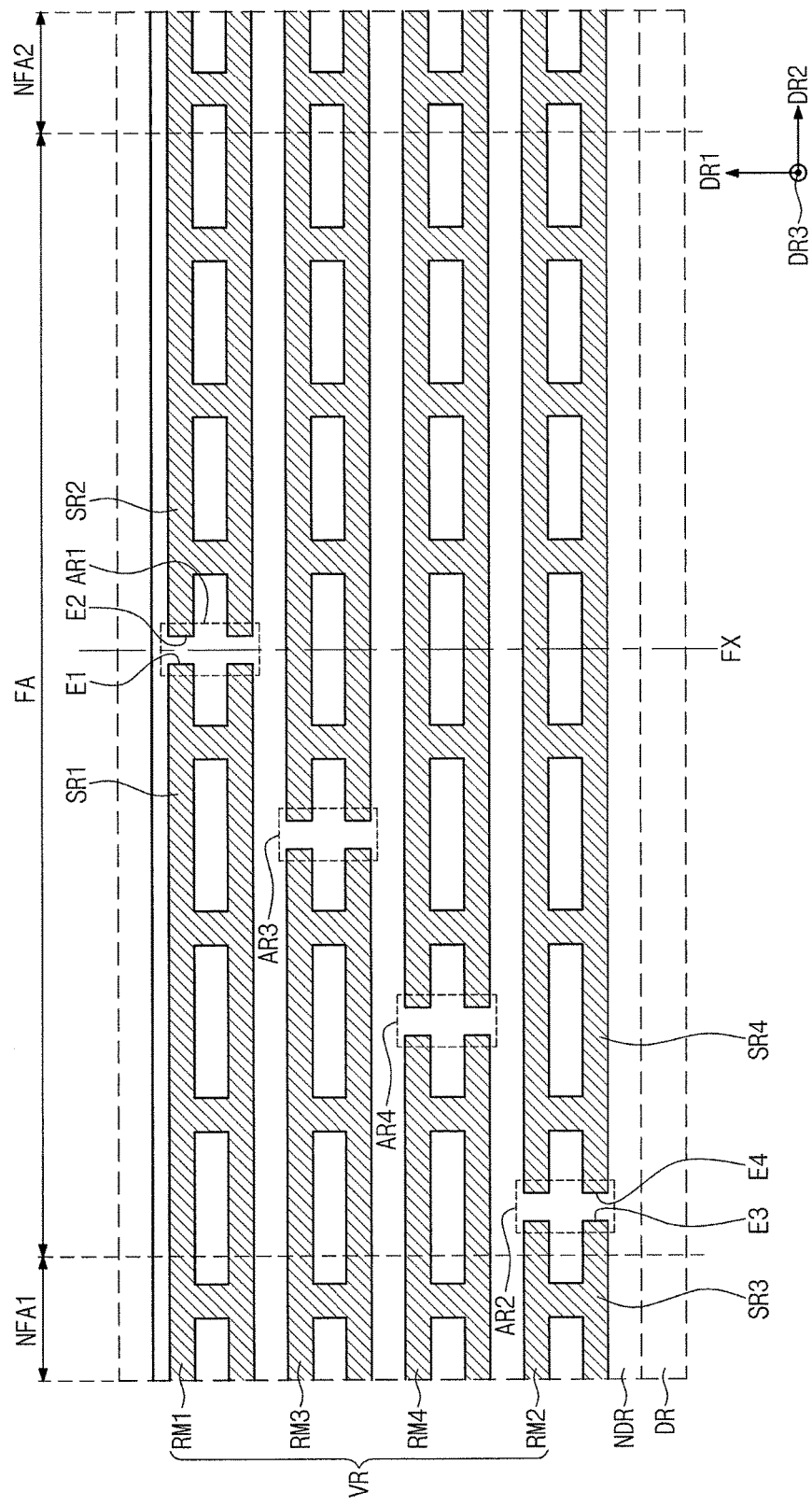
FIG. 4 illustrates area AA in the state of FIG. 1C.

FIG. 4 is an enlarged view of area AA when the display apparatus of FIG. 2 is in the same state as that of FIG. 1C. Referring to FIGS. 1C and 4, the display apparatus DD is folded with the second curvature that is greater than the first curvature. Accordingly, the foldable area FA of the display apparatus DD that is folded with the second curvature may be greater than the foldable area FA of the display apparatus DD that is folded with the first curvature.

When the display apparatus DD is folded with the second curvature, the foldable area FA may overlap the first area AR1, the second area AR2, the third area AR3, and the fourth area AR4. Accordingly, tensile force may be generated in the first area AR1, the second area AR2, the third area AR3, and the fourth area AR4.

Thus, the first end E1 and the second end E2 disposed on the first area AR1 that is nearest to the folding axis FX, and the third end E3 and the fourth end E4 disposed on the second area AR2 that is farthest away from the folding axis FX, may be in a non-contact state.

When all of the first to fourth resistance parts RM1, RM2, RM3, and RM4 vary in resistance, the controller of the display apparatus DD may turn a screen of the display panel 100 off to reduce power consumption. The case of inner folding has been previously described. However, the display apparatus DD may also be folded outwardly. When the display apparatus DD is folded outwardly, a portion of the display screen on which display of the image is unnecessary may be turned off, or a specific operation may be performed on this portion of the screen.

FIGS. 3 and 4 illustrate a case in which all of the first resistance parts RM1, RM2, RM3, and RM4 vary in resistance when the first resistance part RM1 varies in resistance. When the display apparatus DD is folded with the third curvature that is greater than the first curvature and less than the second curvature, only the first and third resistance parts RM1 and RM3 may vary in resistance. Also, when the display apparatus DD is folded with the fourth curvature that is greater than the third curvature and less than the second curvature, only the first resistance part RM1, the third resistance part RM3 and the fourth resistance part RM4 may vary in resistance.

According to the current embodiment, the controller may predict the curvature radius with which the display apparatus DD is folded based on the variation in resistance of the first to fourth resistance parts RM1, RM2, RM3, and RM4. Thus, the controller may compensate data input to the display panel 100 in order to improve display quality or change UI or UX according to the folded state to provide various use environments to a user based on the variation in resistance of the first to fourth resistance parts RM1, RM2, RM3, and RM4.

Figure 5:
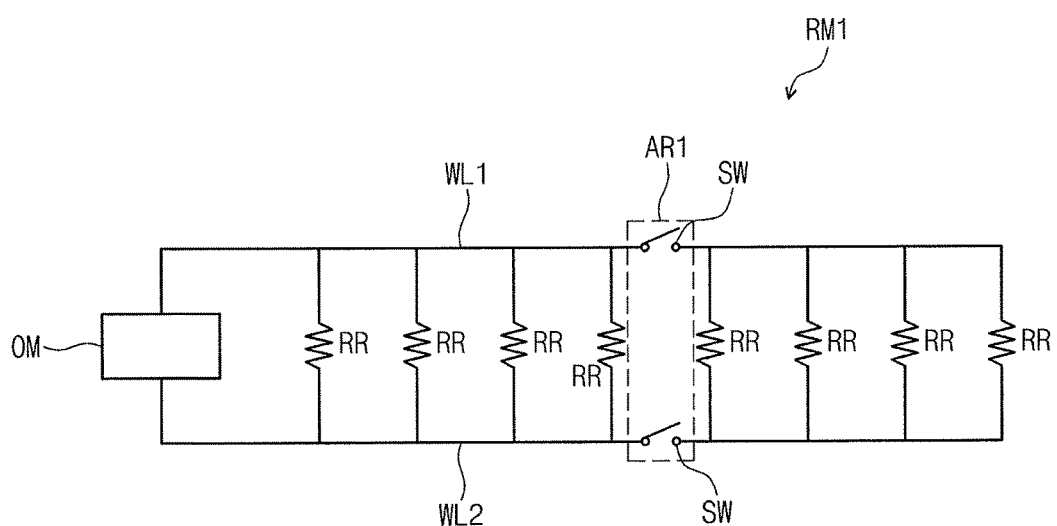
FIG. 5 illustrates an embodiment of a first resistance unit.

FIG. 5 is an embodiment of an equivalent circuit of the first resistance part of FIG. 4. Referring to FIGS. 4 and 5, the first metal line ML1 of the first resistance part RM1 may correspond to a first wire WL1. The second metal line ML2 may correspond to a second wire WL2. The third metal lines ML3 may respectively correspond to resistors RR. The first and second ends E1 and E2 that are in the first area AR1 may correspond to a switch SW. The first resistance part RM1 may be electrically connected, for example, to an ohmmeter OM for measuring resistance. The resistors RR may be connected in parallel to each other by the first and second wires WL1 and WL2.

When the switch SW is turned on, all of the resistors RR of the first resistance part RM1 may be connected in parallel to each other. The turn-on of the switch SW may correspond to a state in which the first end E1 and the second end E2 contact each other. When the resistance of each of the resistors RR is X and the first end E1 and the second end E2 contact each other, the resistance of the first resistance part RM1 may be X/8. Although eight resistors RR are illustrated in FIG. 5, the number of resistors RR may be different in another embodiment.

When the switch SW is turned off, only a portion of the resistors RR of the first resistance part RM1 may be connected in parallel to each other. For example, when the first end E1 and the second end E2 do not contact each other, the resistance of the first resistance part RM1 may be X/4.

The variation in resistance generated when the first resistance part RM1 receives tensile and compressive force and then is strained may be relatively small. However, according to one embodiment, since a portion of the resistors RR that are connected in parallel to each other is electrically disconnected from each other, the variation in resistance may be greater than that of the resistance generated by the strain. Accordingly, information with respect to the folded state may be more easily determined.

The ohmmeter OM may be electrically connected to an end of the first resistance part RM1. Also, in one embodiment, the ohmmeter OM may be electrically connected to each of ends of the second to fourth resistance parts RM2, RM3, and RM4. In one embodiment, the ohmmeter OM may face the folding axis FX with the second to fourth areas AR2, AR3, and AR4 therebetween. In this case, the variation in resistance may be more easily determined when two sub resistance parts facing each other change between a mutual contact state and a mutual non-contact state. In case of the fourth resistance part RM4, resistance of the eight third metal lines ML3 may be measured when the third end E3 and the fourth end E4 contact each other, and resistance of one of the third metal lines ML3 may be measured when the third end E3 and the fourth end E4 do not contact each other. Thus, since the variation in resistance is relatively large, the variation in resistance may be more easily determined.

In the current embodiment, one ohmmeter OM may sequentially measure the resistance of the first to fourth resistance parts RM1, RM2, RM3, and RM4. In another embodiment, a plurality of ohmmeters OM may be provided to respectively measure the resistance of the first to fourth resistance parts RM1, RM2, RM3, and RM4.

Figure 6:
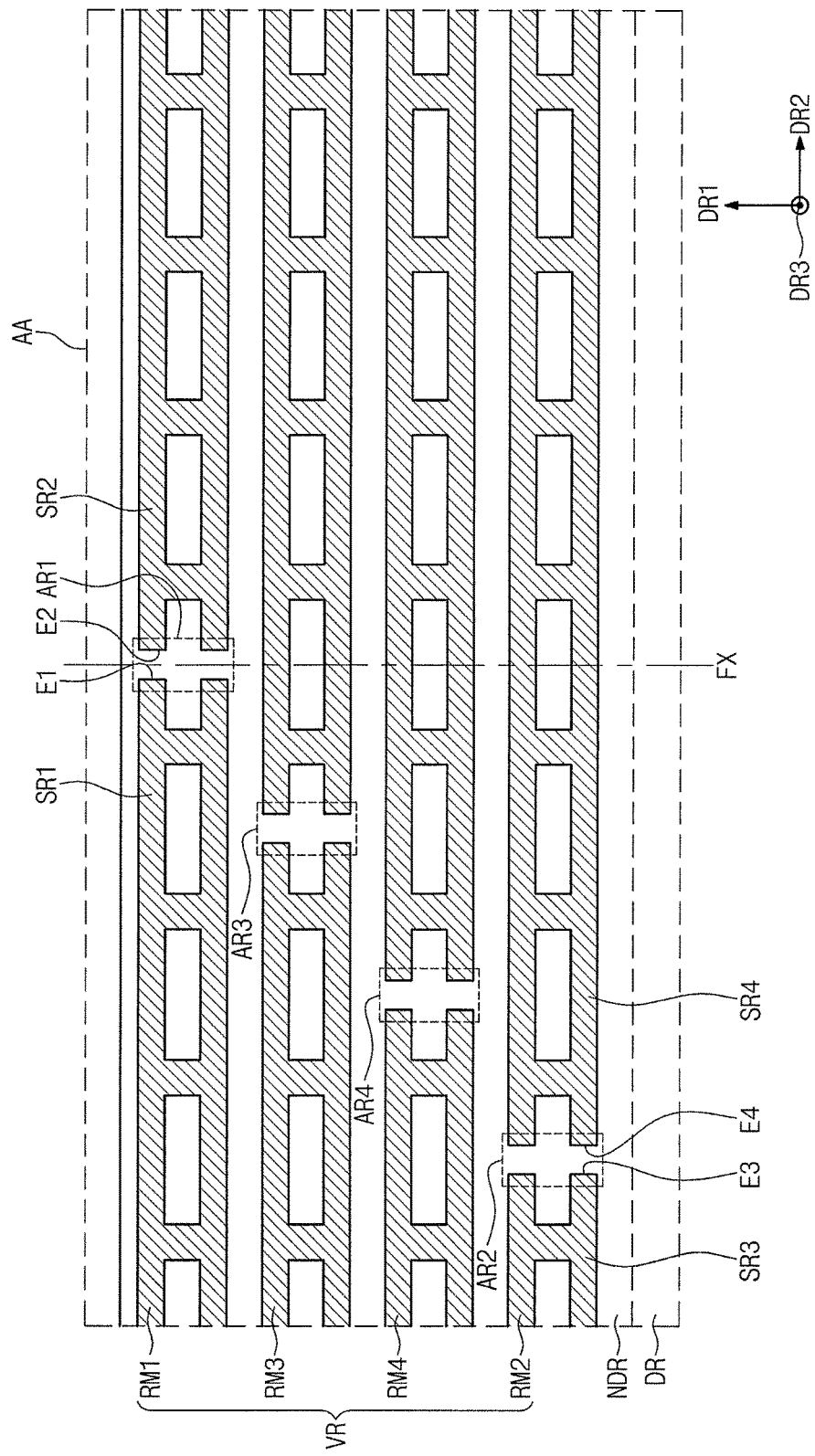
FIG. 6 illustrates another embodiment of area AA.
Figure 7:
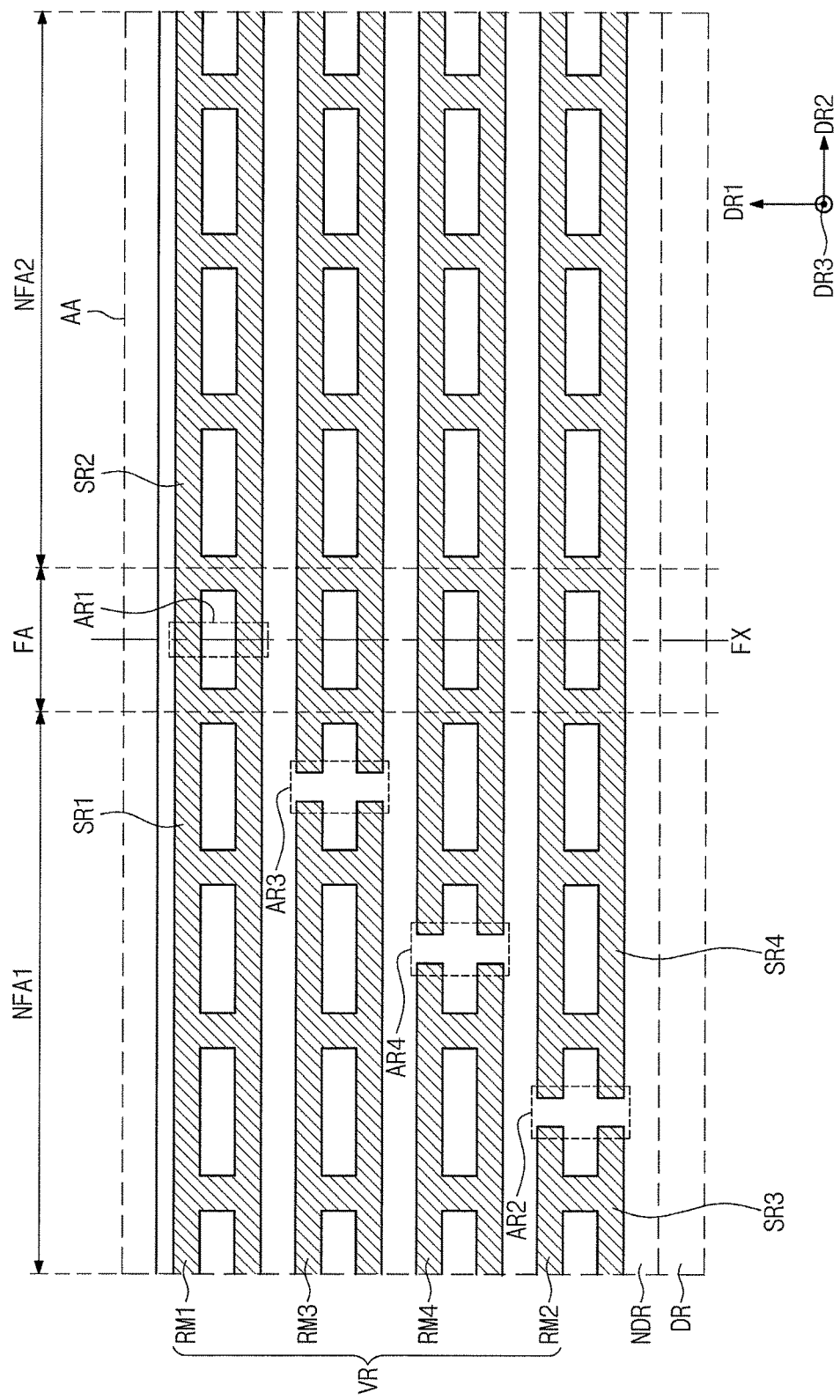
FIG. 7 illustrates area AA in FIG. 6 in the state of FIG. 1B.
Figure 8:
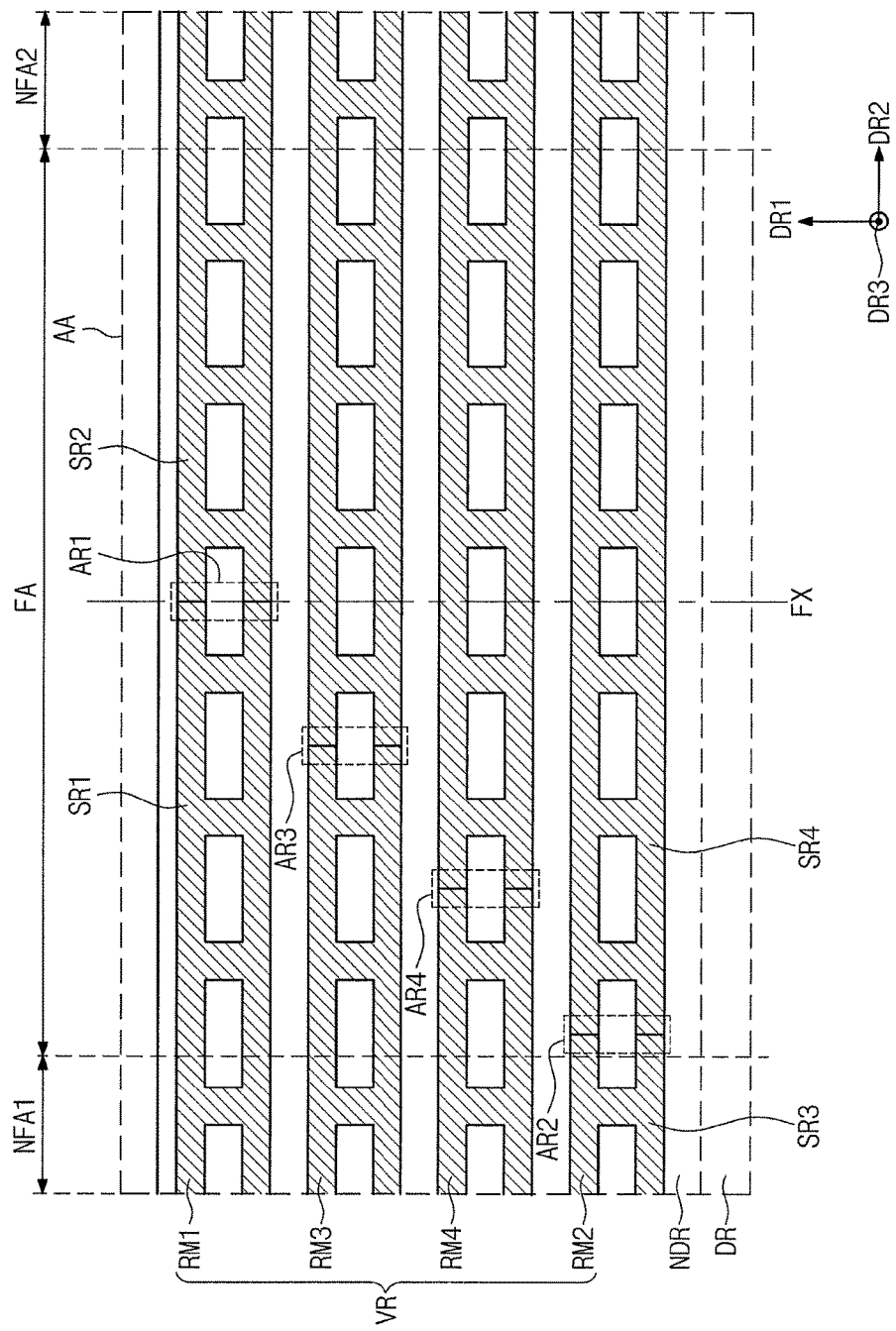
FIG. 8 illustrates area AA in FIG. 6 is in the state of FIG. 1C.

FIG. 6 is an enlarged view of area AA of FIG. 1A according to another embodiment. FIG. 7 is an enlarged view of area AA when the display apparatus of FIG. 6 has the same state as that of FIG. 1B. FIG. 8 is an enlarged view of area AA when the display apparatus of FIG. 6 has the same state as that of FIG. 1C.

Referring to FIGS. 6, 7, and 8, the variable resistance part VR may be on the compressive unit (see, e.g., reference symbol CS of FIG. 1B) of the display apparatus DD. When the display apparatus DD is flat, the sub resistance parts of each of the first to fourth resistance parts RM1, RM2, RM3, and RM4 may not contact each other. When the display apparatus DD is folded with the first curvature as in FIG. 1B, the first and second sub resistance parts SR1 and SR2 of the first resistance part RM1 may change from the mutual non-contact state to the mutual contact state. Also, the sub resistance parts of each of the second to fourth resistance parts RM2, RM3, and RM4 may be maintained in the mutual non-contact state. Thus, when the display apparatus DD is folded with the first curvature, the first resistance part RM1 may be reduced in terms of resistance.

When the display apparatus DD is slowly folded from the first curvature to the second curvature that is greater than the first curvature, the ends of the sub resistance parts on the area adjacent to the folding axis FX may sequentially change from the non-contact state to the contact state.

As the display apparatus DD is folded with a large curvature, an area in which stress is generated may expand in a second direction DR2 crossing the first direction DR1 and a direction opposite to the second direction DR2 on the basis of the folding axis FX. Accordingly, the contact state of the end of each of the sub resistance parts that are disposed sequentially on the first area AR1, the third area AR3, the fourth area AR4, and the second area AR2 based on the distance from the folding axis FX may be changed.

When the display apparatus DD is folded with the second curvature or more, the third and fourth sub resistance parts SR3 and SR4 of the second resistance part RM2 disposed on the fourth area AR4 that is farthest away from the folding axis FX may change from the mutual non-contact state into the mutual contact state.

The controller of the display apparatus DD may compensate the data input to the display panel 100 on the basis of whether the first to fourth resistance parts RM1, RM2, RM3, and RM4 vary in resistance, in comparison to the resistance when the display apparatus DD is flat.

Figure 9:
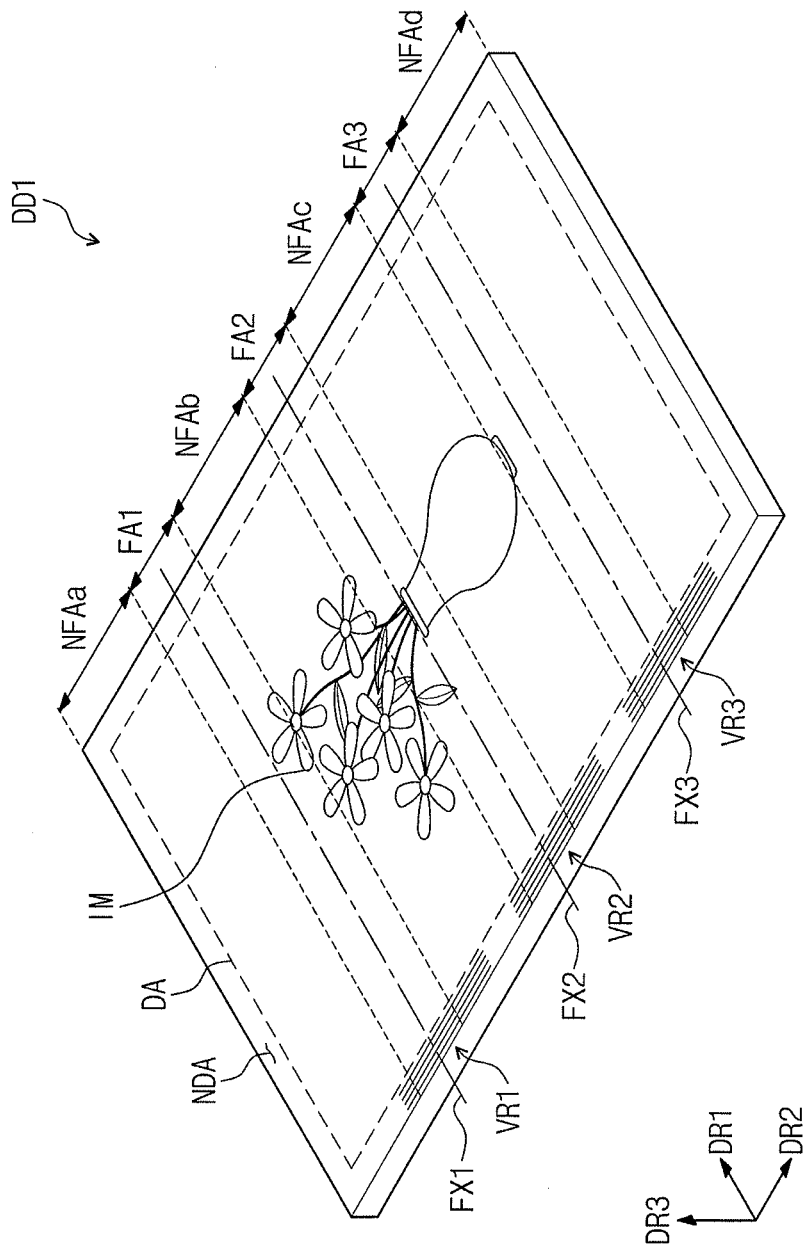
FIG. 9 illustrates another embodiment of a display apparatus.

FIG. 9 illustrates another embodiment of a display apparatus DD1 which includes a first folding axis FX1, a second folding axis FX2, and a third folding axis FX3 that extend in a first direction DR1. The first folding axis FX1, the second folding axis FX2, and the third folding axis FX3 are spaced apart from each other in a second direction DR2 crossing the first direction DR1.

The display apparatus DD1 may include a first foldable area FA1 folded along a first folding axis FX1, a second foldable area FA2 folded along a second folding axis FX2, a third foldable area FA3 folded along a third folding axis FX3, and first to fourth non-foldable areas NFAa, NFAb, NFAc, and NFAd that are not folded. The first to third foldable areas FA1, FA2, and FA3 may be areas that are strained as the display apparatus DD1 is folded.

The display apparatus DD1 may include a first variable resistance area VR1, a second variable resistance area VR2, and a third variable resistance area VR3. The first variable resistance area VR1 may overlap an area on which the first foldable area FA1 and the non-display area NDA overlap each other. The second variable resistance area VR2 may overlap an area on which the second foldable area FA2 and the non-display area NDA overlap each other. The third variable resistance area VR3 may overlap an area on which the third foldable area FA3 overlaps the non-display area NDA. Each of the first to third variable resistance areas VR1, VR2, and VR3 may have substantially the same shape as the variable resistance area VR described with reference to FIGS. 2 to 8.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers and other processing features of the embodiments disclosed herein may be implemented in logic which, for example, may include hardware, software, or both. When implemented at least partially in hardware, the controllers and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, the display apparatus may include a resistance unit having a resistance that varies when the display apparatus is folded with a predetermined curvature or more. Thus, the display apparatus may easily determine the folded position and folded degree of the display apparatus by the resistance unit. Also, a controller may compensate data input to the display panel according to the folded position and the folded degree of the display apparatus in order to improve display quality. Also, the controller may change the UI or UX displayed on the display panel according to the folded position and folded degree of the display apparatus to provide various use environments to the user.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the following claims.

What is claimed is:

1. A display apparatus, comprising:
a display panel to display an image, the display panel including a foldable area, a non-foldable area, and a folding axis; and
a variable resistance area to overlap the foldable area, wherein the variable resistance area includes:
a first resistance part having a first resistance when the display apparatus is folded with a curvature greater than a first curvature and a second resistance different from the first resistance when the display apparatus is folded with a curvature less than the first curvature; and
a second resistance part having a third resistance when the display apparatus is folded with a curvature greater than a second curvature and a fourth resistance different from the third resistance when the display apparatus is folded with a curvature less than the second curvature, the second curvature being greater than the first curvature, wherein:
the first resistance part includes a first sub resistance part and a second sub resistance part,
the second resistance part includes a third sub resistance part and a fourth sub resistance part,
when the display apparatus is folded with the first curvature or more, the first sub resistance part and the second sub resistance part are to change from between a mutual contact state and a mutual non-contact state, and
when the display apparatus is folded with the second curvature or more, the third sub resistance part and the fourth sub resistance part are to change between the mutual contact state and the mutual non-contact state.

2. The display apparatus as claimed in claim 1, wherein:
a first end of the first sub resistance part contacting the second sub resistance part and a second end of the second sub resistance part contacting the first sub resistance part are in a first area adjacent to a folding axis, and
a third end of the third sub resistance part contacting the fourth sub resistance part and a fourth end of the fourth sub resistance part contacting the third sub resistance part are in a second area, and
the second area is spaced apart from the folding axis in a second direction crossing a first direction in which the folding axis extends.

3. The display apparatus as claimed in claim 2, wherein:
when the display apparatus is folded with the first curvature, the first area is to overlap the foldable area, and
when the display apparatus is folded with the second curvature, the first area and the second area are to overlap the foldable area.

4. The display apparatus as claimed in claim 1, wherein:
when the first sub resistance part and the second sub resistance part contact each other, the first resistance part has resistance less than the first resistance part when the first sub resistance part and the second sub resistance part do not contact each other, and
when the third sub resistance part and the fourth sub resistance part contact each other, the second resistance part has resistance less than the second resistance part when the third sub resistance part and the fourth sub resistance part do not contact each other.

5. The display apparatus as claimed in claim 1, wherein each of the first sub resistance part, the second sub resistance part, the third sub resistance part, and the fourth sub resistance part includes:
a first metal line extending in a second direction crossing a first direction in which the folding axis extends;
a second metal line spaced apart from the first metal line in the first direction, the second metal line extending in the second direction; and
a plurality of third metal lines to electrically connect the first metal line to the second metal line.

6. The display apparatus as claimed in claim 5, wherein the third metal lines are spaced apart from each other in the second direction.

7. The display apparatus as claimed in claim 1, wherein:
when a surface in which a strain is not generated when the display apparatus is folded with a predetermined curvature corresponds to a neutral surface, the display apparatus is divided into a compressive area adjacent to a curvature center of the predetermined curvature and a tensile area facing the compressive area, with the neutral surface therebetween with respect to the neutral surface, and the variable resistance area is on at least one of the compressive area or the tensile area.

8. The display apparatus as claimed in claim 7, wherein the variable resistance area is on the compressive area:
when the display apparatus is folded with the first curvature, the first sub resistance part and the second sub resistance part are to change from the mutual non-contact state to the mutual contact state, and the third sub resistance part and the fourth sub resistance part are maintained in the mutual non-contact state, and when the display apparatus is folded with the second curvature or more, the third sub resistance part and the fourth sub resistance part are to change from the mutual non-contact state into the mutual contact state.

9. The display apparatus as claimed in claim 7, wherein the variable resistance area is on the tensile area:

when the display apparatus is folded with the first curvature, the first sub resistance part and the second sub resistance part are to change from the mutual contact state into the mutual non-contact state, and when the display apparatus is folded with the second curvature or more, the third sub resistance part and the fourth sub resistance part are to change from the mutual contact state into the mutual non-contact state.

10. The display apparatus as claimed in claim 1, further comprising:

at least one resistance measuring circuit to measure resistance of each of the first and second resistance parts.

11. The display apparatus as claimed in claim 1, further comprising: a controller to determine different degrees of curvature of the display apparatus based on at least two of: the first resistance, the second resistance, the third resistance, and the fourth resistance.

12. The display apparatus as claimed in claim 1, wherein the controller is to perform different degrees of compensation for data input to the display panel based on the different degrees of curvature.

13. A portable terminal, comprising:

a display panel to display an image, the display panel including a first folding axis in a first foldable area extending in a first direction; and a first resistance part to overlap the first foldable area, the first resistance part to vary in resistance when the portable terminal is folded with a first curvature or more, wherein the first resistance part includes:

a first sub resistance part; and a second sub resistance part to change between a state contacting the first sub resistance part to and a state non-contacting the first sub resistance part when the portable terminal is folded with the first curvature or more.

14. The portable terminal as claimed in claim 13, further comprising:

a second resistance part to overlap the first foldable area, the second resistance part varying in resistance when the portable terminal is folded with a second curvature that is greater than the first curvature, the second resistance part including:

a third sub resistance part; and a fourth resistance part to change between a state contacting the third sub resistance part and a state non-contacting the third sub resistance part when the portable terminal is folded with the second curvature or more.

15. The portable terminal as claimed in claim 14, wherein:

a first area on which the first and second sub resistance parts contact each other is to overlap the first folding axis or is to be spaced a first distance from the first folding axis in a second direction crossing the first direction on a plane, and a second area on which the third and fourth sub resistance parts contact each other is to be spaced a second distance greater than the first distance from the first folding axis in the second direction.

16. The portable terminal as claimed in claim 14, wherein each of the first, second, third, and fourth sub resistance parts includes:

a first metal line extending in a second direction crossing the first direction;

a second metal line spaced apart from the first metal line in the first direction and extending in the second direction; and a plurality of third metal lines to electrically connect the first and second metal lines to each other.

17. The portable terminal as claimed in claim 14, wherein:

when a surface in which strain is not generated when the portable terminal is folded with a predetermined curvature corresponds to a neutral surface, the portable terminal is divided into a compressive area adjacent to a curvature center of the predetermined curvature and a tensile area facing the compressive area, with the neutral surface therebetween with respect to the neutral surface, and the first and second resistance parts are on at least one of the compressive area or tensile area.

18. The portable terminal as claimed in claim 17, wherein the first and second resistance parts are on the compressive area:

when the portable terminal is folded with the first curvature, the first sub resistance part and the second sub resistance part are to change from a mutual non-contact state to a mutual contact state, and the third sub resistance part and the fourth sub resistance part are to be maintained in the mutual non-contact state, and when the portable terminal is folded with the second curvature or more, the third sub resistance part and the fourth sub resistance part are to change from the mutual non-contact state to the mutual contact state.

19. The portable terminal as claimed in claim 17, wherein the first and second resistance parts are on the tensile area:

when the portable terminal is folded with the first curvature, the first sub resistance part and the second sub resistance part are to change from a mutual contact state to a mutual non-contact state, the third sub resistance part and the fourth sub resistance part are to be maintained in the mutual contact state, and when the portable terminal is folded with the second curvature or more, the third sub resistance part and the fourth sub resistance part are to change from the mutual contact state to the mutual non-contact state.

20. The portable terminal as claimed in claim 13, further comprising:

a second foldable area spaced apart from the first foldable area in a second direction crossing the first direction;

a second folding axis in the second foldable area; and a second resistance part on the second foldable area, wherein the second resistance part is to vary in resistance when the portable terminal is folded with a second curvature or more, and wherein the second resistance part includes:

a third sub resistance part; and a fourth sub resistance part to change from a state contacting the third sub resistance part and a state non-contacting the third sub resistance part when the portable terminal is folded with the second curvature or more.

21. A display apparatus comprising:

a display panel including a display area and a non-display area, the display panel to fold on the basis of a folding axis; and a resistance area overlapping the non-display area, the resistance area to vary in resistance when the display panel is folded with a predetermined curvature or more, wherein:

the resistance area includes a first sub resistance part and a second sub resistance part to contact or non-contact an end of the first sub resistance part, when the display panel is folded with a predetermined curvature or more, the first and second sub resistance parts are to change from between a mutual contacting state and mutual non-contact state.

\* \* \* \* \*